United States Patent
Fujikawa et al.

(10) Patent No.: US 9,017,483 B2
(45) Date of Patent: Apr. 28, 2015

(54) SUSCEPTOR FOR VAPOR PHASE EPITAXIAL GROWTH DEVICE

(75) Inventors: Takashi Fujikawa, Tokyo (JP); Masayuki Ishibashi, Tokyo (JP); Kazuhiro Iriguchi, Nagasaki (JP); Kouhei Kawano, Nagasaki (JP)

(73) Assignees: Sumco Corporation, Tokyo (JP); Sumco Techxiv Corp., Nagasaki (JP)

( * ) Notice: Subject to any disclaimer, the term of this patent is extended or adjusted under 35 U.S.C. 154(b) by 1121 days.

(21) Appl. No.: 12/364,149

(22) Filed: Feb. 2, 2009

(65) Prior Publication Data

US 2009/0235867 A1 Sep. 24, 2009

(30) Foreign Application Priority Data

Mar. 21, 2008 (JP) ................................. 2008-073575

(51) Int. Cl.
*C23C 16/458* (2006.01)
*C30B 25/12* (2006.01)

(52) U.S. Cl.
CPC ............. *C30B 25/12* (2013.01); *C23C 16/4588* (2013.01)

(58) Field of Classification Search
CPC ............ C23C 16/4585; C23C 16/4586; C23C 16/4581; C23C 16/4583; C23C 16/4588; H01L 21/68735; C30B 25/12
USPC ...................................... 156/345.51; 118/728
See application file for complete search history.

(56) References Cited

U.S. PATENT DOCUMENTS

| 5,326,725 A * | 7/1994 | Sherstinsky et al. ........... 438/778 |
| 5,556,475 A * | 9/1996 | Besen et al. ............ 118/723 MP |
| 5,870,271 A * | 2/1999 | Herchen ........................ 361/234 |
| 2003/0029571 A1* | 2/2003 | Goodman et al. ........ 156/345.51 |
| 2008/0110401 A1 | 5/2008 | Fujikawa et al. |
| 2008/0314319 A1* | 12/2008 | Hamano et al. ................ 118/728 |

FOREIGN PATENT DOCUMENTS

| JP | 8-8198 | 1/1996 |
| JP | EP1840243 A3 * | 2/2008 |
| JP | 2008277795 A * | 11/2008 |

OTHER PUBLICATIONS

Machine Generated English Translation of JP2008277795A published Nov. 13, 2008.*
English language Abstract of JP 08-8198, Jan. 12, 1996.

* cited by examiner

*Primary Examiner* — Sylvia R MacArthur
(74) *Attorney, Agent, or Firm* — Greenblum & Bernstein, P.L.C.

(57) ABSTRACT

There is provided a susceptor for a vapor phase epitaxial growth device, by which skidding at the time of loading a silicon wafer is prevented and the wafer can be loaded at a fixed position of the susceptor: wherein a ring-shaped groove having sloping planes widening toward a surface of the susceptor are formed on the outermost circumference of the bottom surface; and gas release openings penetrating through to the back surface of the susceptor are formed, each having a sectional area of 2.0 to 3.0 $mm^2$ and a ratio of all opening areas is 0.25 to 0.5% on the bottom surface.

8 Claims, 7 Drawing Sheets

FIG.4
(A)
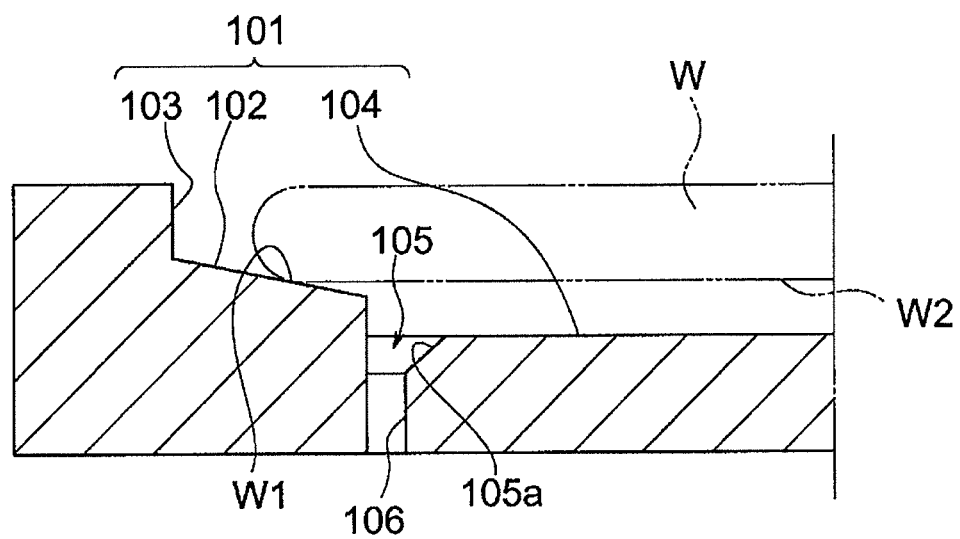
(B)
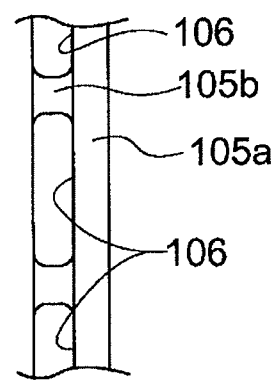

SUSCEPTOR FOR VAPOR PHASE EPITAXIAL GROWTH DEVICE

BACKGROUND OF THE INVENTION

1. Field of the Invention

The present invention relates to a susceptor used for a vapor phase epitaxial growth device for growing an epitaxial layer on a surface of a silicon wafer and, particularly, relates to a susceptor for a vapor phase epitaxial growth device capable of enabling a silicon wafer to be loaded on a fixed position on the susceptor as a result of preventing skidding when loading the wafer.

2. Description of the Related Art

A so-called single wafer vapor phase epitaxial growth device is known as a vapor phase epitaxial growth device for growing a high quality epitaxial film on a wafer surface.

In this kind of single wafer vapor phase epitaxial growth device, a disk-shaped susceptor formed by coating silicon carbide SiC on graphite as a mother material is provided in a channel-shaped chamber made by quartz, and a wafer is loaded on the susceptor and brought to react with various material gases passing through the chamber while heating the wafer by a heater arranged on an outer surface of the chamber, so as to grow an epitaxial film on the wafer.

On the surface of the susceptor for a wafer to be loaded, a recessed portion (depression) called a wafer pocket is formed, which is a little larger than the wafer and has a depth of about a wafer thickness, and a wafer is placed in this pocket.

There is a minute clearance for allowing reaction gases to path through between the wafer and the wafer pocket. Therefore, in a film forming process of an epitaxial film, a reaction film having the several dozen of nm order is deposited on an outer circumferential area on the back surface of the wafer; but a film thickness of this reaction film has to be as uniform as possible because it affects flatness of the wafer. Particularly, along with device design rules becoming finer, total control of thickness and shape considering even reaction films formed on the back surface of the wafer has become necessary.

However, when a growth reaction of an epitaxial film is performed in a state that the center of the wafer is deviated from the center of the wafer pocket, a clearance size between the wafer and the wafer pocket becomes uneven in the circumferential direction and, thereby, flatness of the wafer declines; that has been a disadvantage.

Given this factor, there is known a technique of preventing skidding of a wafer when loading the wafer on the susceptor by making a wafer loading surface of the susceptor a flat surface and forming through holes (having a diameter of 10 mm) allover the loading surface to release gases at the time of loading, wherein a ratio of opening areas is 5 to 10% (Patent Article 1).

However, it was found that, when dropping a wafer with super flatness on a susceptor having a high ratio of opening area of through holes or on a susceptor having large diameter holes, speed of releasing gases cannot be same between the through holes and the balance is lost, and that results in an opposite effect of causing skidding of wafers. A reason for this is considered that, when loading a wafer with high flatness on a wafer pocket manufactured with high accuracy, a minute clearance (a nanometer level) between the wafer and the wafer pocket becomes furthermore minuter and releasing of gases at the time of loading is attained only by the through holes. This wafer skidding problem appears notably particularly when dropping by a Bernoulli chuck a large diameter wafer with super flatness on a wafer pocket manufactured with high accuracy.

Patent Article 1: Japanese Unexamined Patent Publication No. H08-8198

SUMMARY OF THE INVENTION

An object of the present invention is to provide a susceptor for a vapor phase epitaxial growth device capable of enabling a silicon wafer to be loaded at a fixed position on the susceptor by preventing skidding of the wafer when loading the wafer.

An invention described in claim 1 is a susceptor for a vapor phase epitaxial growth device, comprising a wafer pocket being recessed from the surface toward the inside for a silicon wafer to be loaded formed therein, wherein:
the wafer pocket comprises
a bottom surface,
a support plane which is formed on an outer circumference of the bottom surface and supports a wafer,
a side surface formed at an outer circumference of the support plane and extending to the susceptor surface;
a ring-shaped groove formed in one row on the outermost circumference of the bottom surface and having a sloping plane widening toward the bottom surface, and
a plurality of gas release openings extending from the ring-shaped groove to penetrate to the back surface of the susceptor, each having an opening area of 2.0 to 3.0 $mm^2$ and having a ratio of opening areas to the bottom surface of 0.25 to 0.5%.

An invention described in claim 2 is the susceptor for a vapor phase epitaxial growth device, wherein the sloping surface is formed on both of the outer circumferential side and inner circumferential side of the gas release openings formed on the groove.

An invention described in claim 3 is the susceptor for a vapor phase epitaxial growth device, wherein the sloping plane is formed only on the inner circumferential side of the gas release openings formed on the groove, and the gas release openings are formed on the outermost circumference of the bottom surface.

An invention described in claim 4 is the susceptor for a vapor phase epitaxial growth device, wherein the ring-shaped groove has a vertical wall at the upper end of the sloping plane.

An invention described in claim 5 is the susceptor for a vapor phase epitaxial growth device, wherein each of the gas release openings is formed to be sloping, so that an opening thereof on the surface side of the susceptor body is positioned front with respect to the opening on the back surface in the rotation direction of the susceptor body.

An invention described in claim 6 is the susceptor for a vapor phase epitaxial growth device, wherein a diameter of the silicon wafer is 300 mm or larger.

An invention described in claim 7 is the susceptor for a vapor phase epitaxial growth device, wherein the support plane is formed by a step portion connecting between the outermost circumference of the bottom surface and the lower end of the side surface.

According to the susceptor for a vapor phase epitaxial growth device of the present invention, it is possible to prevent skidding when loading a silicon wafer and the wafer can be loaded at a fixed position on the susceptor.

BRIEF DESCRIPTION OF DRAWINGS

These and other objects and features of the present invention will become clearer from the following description of the preferred embodiments given with reference to the attached drawings, in which:

FIG. 4A is a half sectional view of another embodiment of the present invention, and FIG. 4B is an enlarged plan view of a ring-shaped groove;

DESCRIPTION OF THE PREFERRED EMBODIMENT

Below, embodiments of the present invention will be explained based on the drawings.

First Embodiment

Figure 1:
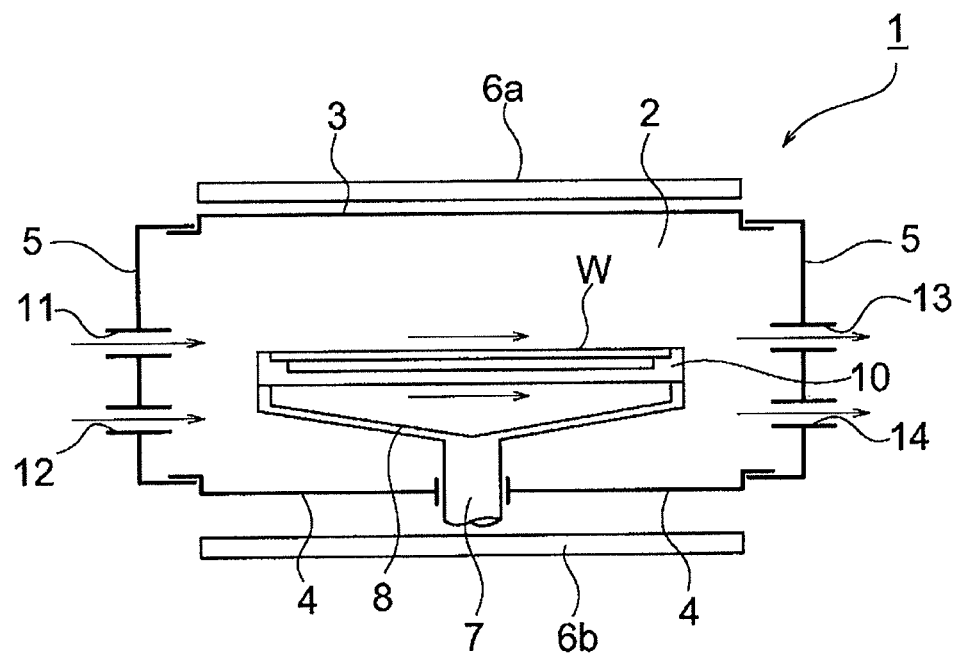
FIG. 1 is a schematic sectional view of an example of a vapor phase epitaxial growth device wherein a susceptor according to an embodiment of the present invention is applied.

FIG. 1 is a schematic sectional view showing a single wafer vapor phase epitaxial growth device 1 for growing an epitaxial film on a surface of a silicon wafer W (hereinafter, also simply referred to as a wafer W), wherein an epitaxial film forming chamber 2 formed by attaching an upper dome 3 and a lower dome 4 to a dome mount 5 is provided. The upper dome 3 and the lower dome 4 are formed by a transparent material, such as quartz, and a susceptor 10 and a wafer W are heated by a plurality of halogen lamps 6a and 6b as heat sources arranged above and below the device 1.

The susceptor 10 is supported at its outer circumferential portion of a lower surface thereof by fitting with a support arm 8 connected to a rotation axis 7 and rotated by driving the rotation axis 7. A material of the susceptor 10 is not particularly limited and, for example, a carbon base material coated with a SiC film thereon is preferably used. A shape thereof will be explained later on.

Note that a method of conveying the wafer W into the susceptor 10 and conveying the wafer W out from the susceptor 10 is not particularly limited, and either of a type of transferring by supporting the wafer by using a Bernoulli chuck or a vacuum chuck and dropping into the wafer pocket and a type of supporting a lower surface of the wafer by pins and moving the pins up and down to transfer the wafer onto the wafer pocket may be applied.

A side surface of the dome mount 5 is provided with a first gas inlet 11 and a second gas inlet 12, and a side surface facing thereto of the dome mount 5 is provided with a first gas outlet 13 and a second gas outlet 14. A reaction gas obtained by diluting a Si source, such as $SiHCl_3$, by a hydrogen gas and mixing the result with a minute quantity of dopant is supplied from the first gas inlet 11 to the forming chamber 2, and the supplied reaction gas passes through a surface of the wafer W to grow an epitaxial film and, then, discharged from the first gas outlet 13 to the outside of the device 1.

Note that a carrier gas, such as a hydrogen gas, is supplied from the second gas inlet 12 toward the lower surface side of the susceptor 10 and discharged from the second gas outlet 14 provided on the downstream side of the carrier gas to the outside of the device 1. As a result, dopant released from the back surface of the wafer can be discharged to the outside of the device 1 more efficiently. However, the second gas inlet 12 and the second gas outlet 14 may be omitted if necessary. Also, when providing the second gas inlet 12 to supply a hydrogen gas or other carrier gas into the forming chamber 2, without providing the second gas outlet 14, the first gas outlet 13 for discharging a reaction gas, etc. for epitaxial growth may be also used as the second gas outlet 14.

Next, the configuration of the susceptor 10 according to the present embodiment will be explained.

FIG. 2A is a half plan view showing the susceptor according to the present embodiment, FIG. 2B is a half sectional view along the line IIB-IIB, FIG. 2C is a plan view showing a ring-shaped groove according to the present embodiment, FIG. 2D is a sectional view along the line IID-IID, and FIG. 2E is a sectional view along the line IIE-IIE.

As shown in FIG. 2A and FIG. 2B, on an upper surface of the susceptor 10 in this embodiment, a wafer pocket 101 made by a recessed portion having a larger diameter than an outer diameter of the wafer W by 1 to 5 mm is formed.

This wafer pocket 101 is configured by a sloping support plane 102 which is sloping so as to support the wafer W by contacting only an outer circumferential portion W1 of the wafer W, a side surface 103 which is a vertical wall surrounding the support plane 102 and a bottom surface 104 formed on an inner side of the support plane. The outer circumferential portion W1 of the wafer W is loaded on the support plane 102, so that a predetermined clearance is secured between the wafer back surface W2 and the bottom surface 104 at the center portion of the wafer W.

Note that the support plane 102 in this embodiment is formed to be sloping as shown in FIG. 2B to linearly contact with the outer circumferential portion W1 of the wafer W, however, it is also possible to form the support plane 102 to be a horizontal plane to contact with the outer circumferential portion W1 of the wafer W by an area or to form fine patterned indents on the support plane 102 to contact with the outer circumferential portion W1 of the wafer W by points.

In the susceptor 10 of the present embodiment, on the outermost circumference of the bottom surface 104, a ring-shaped groove 105 is formed around in one row, which has sloping planes 105a widening toward the upper surface of the susceptor 10. FIG. 2C to FIG. 2E show a part of the ring-shaped groove 105 enlarged.

The ring-shaped groove 105 of the present embodiment has a bottom portion 105b forming a groove configuration and two sloping planes 105a formed on both sides of the bottom portion 105b. There are a plurality of gas release openings 106 formed at predetermined intervals on the bottom portion 105b of the ring-shaped groove 105 penetrating to the back surface of the susceptor 10.

The gas release openings 106 are through holes each shaped to be rectangular or oval having an opening area of 2.0 to 3.0 mm². The number and intervals of the gas release openings 106 are set, so that the ratio of opening areas (a ratio of total opening areas of the gas release openings 106 to an area of the bottom surface 104 of the susceptor 10) of the gas release openings 106 formed on one susceptor 10 becomes 0.25 to 0.5%.

The gas release openings 106 of the present embodiment are through holes which prevent skidding of the wafer W by releasing a gas between the wafer W and the wafer pocket 101 to below the susceptor 10 when loading; that is, after bringing in the wafer W carried on a quartz board, supporting the lower surface of the wafer W by pins, then, lowering the pins to load the wafer W from above onto the wafer pocket 101.

In the susceptor 10 of the present embodiment, gas release openings 106 each having a relatively small diameter (the opening area is 2.0 to 3.0 mm$^2$) are formed at a relatively low opening area ratio (0.25 to 0.5%) and arranged to be one row on the outermost circumference of the bottom surface 104 on the inner side of the support plane 102 to which the outer circumferential portion W1 of the wafer W contacts; therefore, when loading the wafer, a gas between the wafer W and the bottom surface 104 is evenly released from the gas release openings 106 to prevent skidding and it is possible to load the wafer W at a targeted position, that is, the center of the susceptor 10 becomes coincident with the center of the wafer W even when loading a large diameter wafer W with super flatness on the support plane 102 of the wafer pocket 101 manufactured with high accuracy. As a result that the wafer W is loaded at the center of the susceptor 10, the clearance between the wafer W and the support plane 102 becomes even in the circumferential direction, consequently, a film thickness of a reaction film to be formed on the outer circumferential portion of the back surface W2 of the wafer W becomes uniform.

Particularly, in the present embodiment, a ring-shaped groove 105 is provided to be one row on the outermost circumference of the bottom surface 104 of the susceptor 10 and the gas release openings 106 are formed therein, therefore, the following gas release effects can be obtained. Namely, when loading the wafer W on the susceptor 10 from above, a carrier gas (hydrogen) between the wafer back surface W2 and the upper surface of the susceptor 10 flows toward the outer circumferential direction of the susceptor 10 or to the direction of the gas release openings 106 to be discharged. Here, a carrier gas around the center portion of the wafer back surface W2 makes a radial flow toward the side surface 103 of the wafer pocket 101.

In the case of a susceptor of the related art wherein gas release openings are not formed, the radial flow flows back at the vertical wall portion from the outermost circumference of the bottom surface 104 to the support plane 102 of the wafer pocket 101, and a flow toward the center portion of the wafer back surface W2 arises to cause a gas (pressure) retention, so that the radial flow of the gas becomes turbulence at the outer circumferential portion. While, in the case of a susceptor of the related art wherein gas release openings are formed evenly allover the susceptor 10, there arises almost no radial flow toward the outer circumferential portion; alternately, in the case where gas release openings are partially formed only at the outer circumferential portion of the susceptor, there arises a radial flow; however, it does not become an even flow on the susceptor 10 surface in both cases and, when observing in the circumferential direction of the wafer W, the speed and retention state become uneven between the portion with the gas release openings and the portion without them.

Alternately, when the ratio of the opening areas is low and a diameter of each opening is large, releasing balance of the whole gas is lost and the gas releasing speed widely varies depending on positions of the openings, so that the wafer does not drop horizontally and is deviated crosswise due to pressure difference and, thereby, the wafer deviates from the targeted position. When the ratio of opening areas is high and the diameter of the openings is large, the speed of releasing gas becomes too fast and, because the wafer contacts linearly with the susceptor support plane, the wafer is liable to bounce, so that there tends to arise a disadvantage of deviating from the targeted position.

On the other hand, in the susceptor 10 of the present embodiment, as a result that the ring-shaped groove 105 is provided on the outermost circumference of the bottom surface 104 and the gas release openings 106 are formed therein, a carrier gas does not retain around the support plane 102 of the wafer pocket 101 and a stable radial flow of gas release is formed. Furthermore, due to a space of the ring-shaped groove 105, it functions as a buffer for the carrier gas to be released and a stable gas flow speed can be obtained. This buffer function is affected by a shape of the ring-shaped groove 105; that is, the widening structure formed by the sloping plane 105*a* on the surface side and the gas release openings 106 being long openings, such as rectangular or oval shape, along the ring-shaped groove 105 contribute to a pressure balance to prevent fluctuations of releasing and attain gradual releasing.

The two sloping planes 105*a* can contribute to stabilize the gas flow rate when they are formed to be sloping by 5 to 30 degrees from the level plane.

Also, the space of the groove structure 105 is 1 to 10% and, preferably, 3 to 7% of the volume of a space between the wafer back surface and the bottom surface 104 of the susceptor 10.

Figure 3:
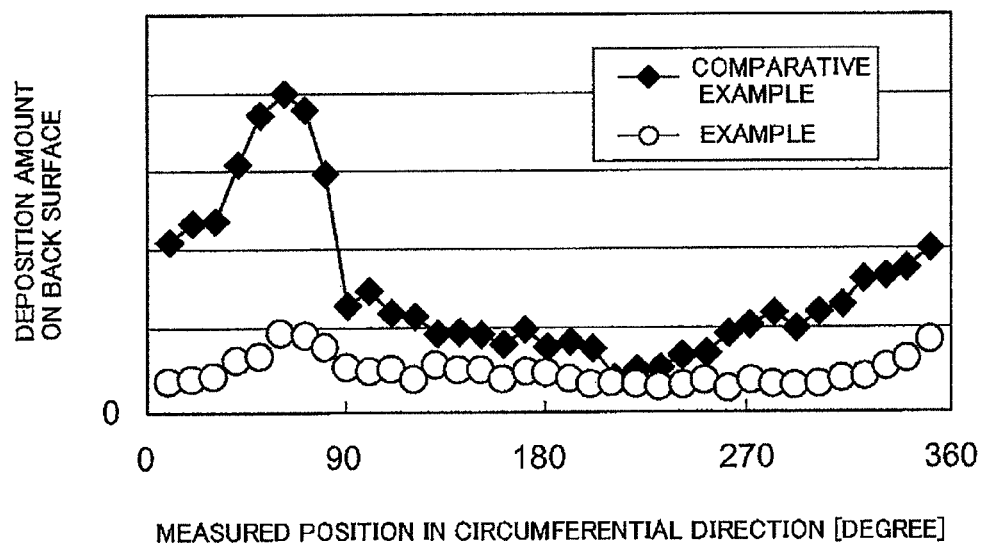
FIG. 3 is a graph showing a state of a back surface of a wafer on which an epitaxial film is grown by using the susceptor according to the embodiment of the present invention.

FIG. 3 is a graph showing results of measuring a film thickness of a reaction film at positions of 2 mm from the outer circumference of a wafer back surface W2 after growing an epitaxial film on the wafer W loaded correctly on the susceptor 10 of the present embodiment. As shown in the graph, uniformity of ±5 nm was confirmed on entire points over the circumferential direction (abscissa). As a comparative example, a susceptor formed by changing through holes of the susceptor described in the patent article 1 to the gas release openings of the susceptor 10 of the present embodiment explained above was prepared. Then, a wafer W having the same diameter was loaded thereon to grow an epitaxial film under the same condition by using the same vapor phase epitaxial growth device. The same graph in FIG. 3 also shows results of measuring a film thickness of a reaction film at positions 2 mm from the outer circumference of a wafer back surface W2. In the wafer of the comparative example, it was confirmed that a difference in the film thickness of the reaction film at a point near the 230 degrees in the circumferential direction and that at the 60 degrees was three times or larger, the center of the wafer was deviated from the center of the wafer pocket when loading the wafer, and clearances were larger at portions around these points.

In the susceptor 10 of the present embodiment, as explained above, it is possible to prevent skidding of a wafer W and to load the wafer W at a targeted position, consequently, a film thickness of a reaction film formed on the back surface becomes uniform and total flatness of the wafer is improved.

Furthermore, other than the above, additional effects as explained below can be obtained.

Namely, in the susceptor 10 of the present embodiment, since the gas release openings 106 are formed to have a relatively small diameter (having an area of 2.0 to 3.0 mm$^2$) at a relatively low opening area ratio (0.25 to 0.5%), a temperature distribution of the wafer W becomes uniform due to an existence of the gas release openings 106. As a result, slip caused by a temperature difference can be reduced and fluctuations of a film thickness of an epitaxial film can be remarkably reduced. Furthermore, a gas is released gradually, so that there arises an additional effect that the back surface hardly gets any scratch due to contact with the susceptor.

[Other Embodiment]

FIG. 4A is a half plan view showing another embodiment of the present invention, and FIG. 4B is an enlarged plan view showing the ring-shaped groove 105.

The ring-shaped groove 105 according to the first embodiment explained above has two sloping planes 105a on both sides, on the outer circumferential side and the inner circumferential side on the bottom portion 105b. While in the present embodiment, the sloping plane on the outer circumferential side is omitted and a sloping plane 105a is formed only on the inner circumferential side of the bottom portion 105b. Along with this, the gas release openings 106 are formed at the outermost circumference on the bottom surface 104 of the wafer pocket 101. Other than that, the configuration is the same as that in the first embodiment explained above.

In this embodiment, as a result that the gas release openings 106 are formed on the furthermore outer circumferential side, when loading a wafer on the susceptor, a gas flew toward outer side hits the vertical wall portion and tends to flow back to the inner direction, however, since the gas release openings 106 are formed at closer position to the vertical wall, a smoother absorbing and releasing effect can be obtained.

Figure 5:
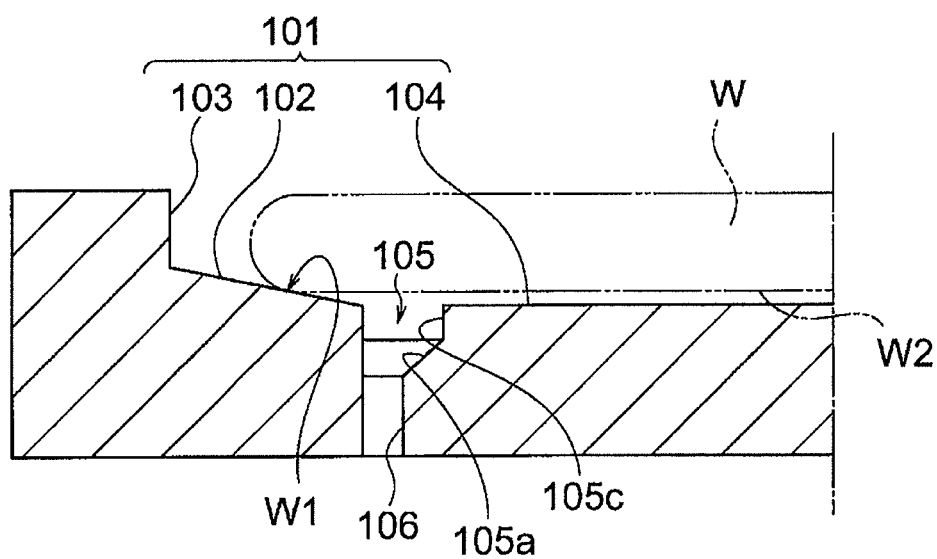
FIG. 5 is a half sectional view of still another embodiment of the present invention.

Note that when forming the gas release openings 106 on the outermost circumference of the bottom surface 104, as shown in FIG. 5, an inner circumferential side wall of each of the gas release openings 106 may be configured to have a sloping plane 105a and a vertical wall 105c. FIG. 5 is a half sectional view showing still another embodiment of the present invention. According to this embodiment, a space between a wafer W and the susceptor 10 can be reduced when the wafer W is loaded, therefore, a temperature difference between the wafer W and the susceptor 10 becomes smaller, temperature uniformity on the wafer surface improves, and arising of slip defects can be suppressed. Also, it is possible to extend an adjusting margin of a temperature distribution.

Figure 6:
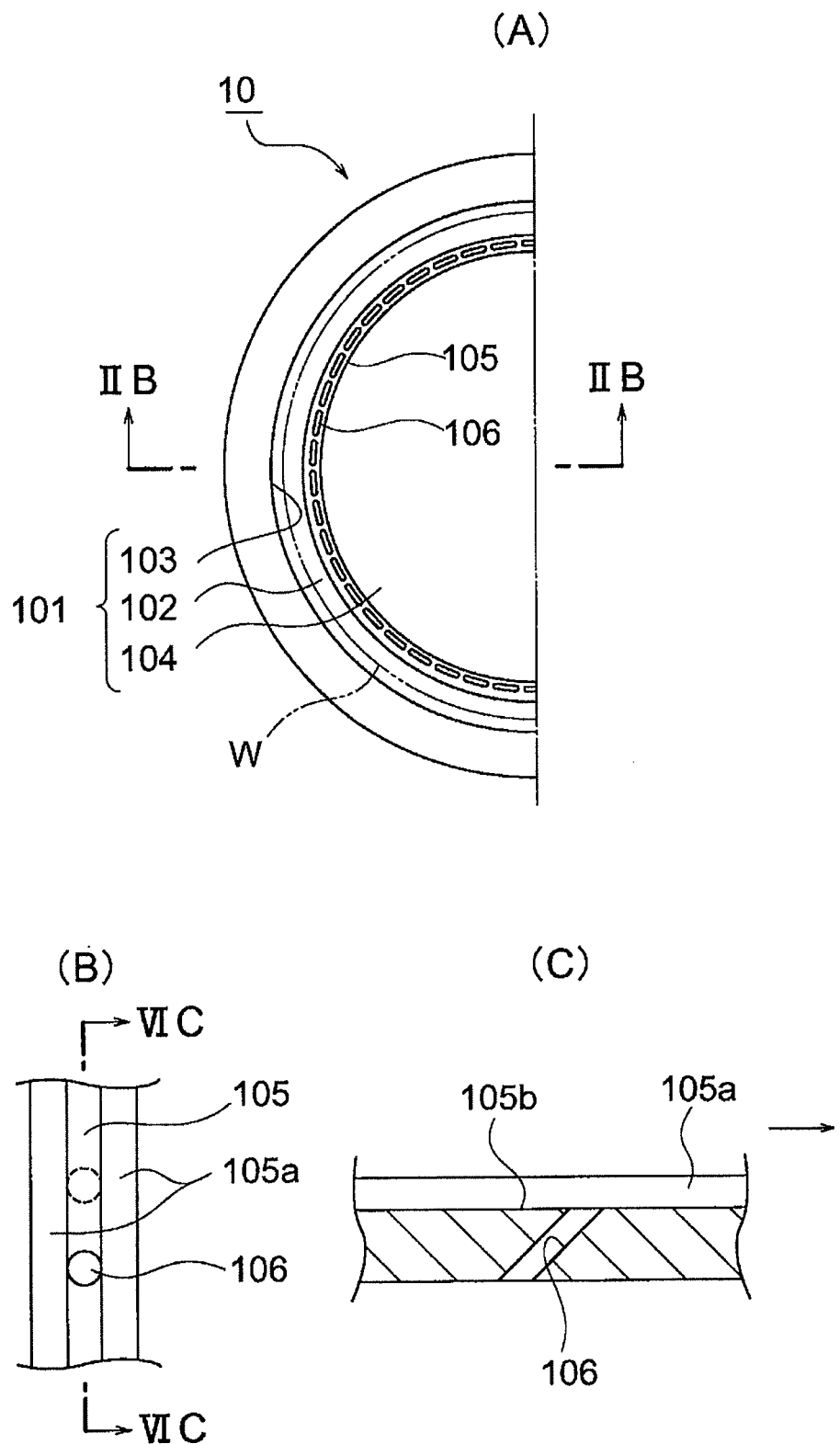
FIG. 6A is a half plan view of a susceptor according to still another embodiment of the present invention.
FIG. 6B is an enlarged plan view of a ring-shaped groove.
FIG. 6C is a sectional view along the line VIC-VIC.

FIG. 6A is a half plan view showing a susceptor according to still another embodiment of the present invention, FIG. 6B is an enlarged plan view showing a groove, and FIG. 6C is a sectional view along the line VIC-VIC.

In the above first embodiment, the gas release openings 106 were formed in the vertical direction with respect to the main surface of the susceptor 10, while gas release openings 106 in the present embodiment are formed to be inclined toward the rotation direction in the vapor phase epitaxial growth device of the susceptor 10. Namely, when assuming that the direction of the arrows in FIG. 6A and FIG. 6C is the rotation direction of the susceptor 10, as shown in FIG. 6C, the openings are inclined so that an upper opening of each of the gas release openings 106 comes front of its lower opening in the rotation direction. As a result, it is possible to prevent an external gas from flowing back through the gas release openings 106 in a state that the susceptor 10 rotates.

EXAMPLES

Next, grounds for setting an opening area of a gas release opening 106 to be 2.0 to 3.0 mm$^2$ and setting the opening area ratio of the gas release openings 106 to the area of the bottom surface 104 to be 0.25 to 0.5% in the above embodiments will be explained based on examples and comparative examples.

Example 1

Figure 2:
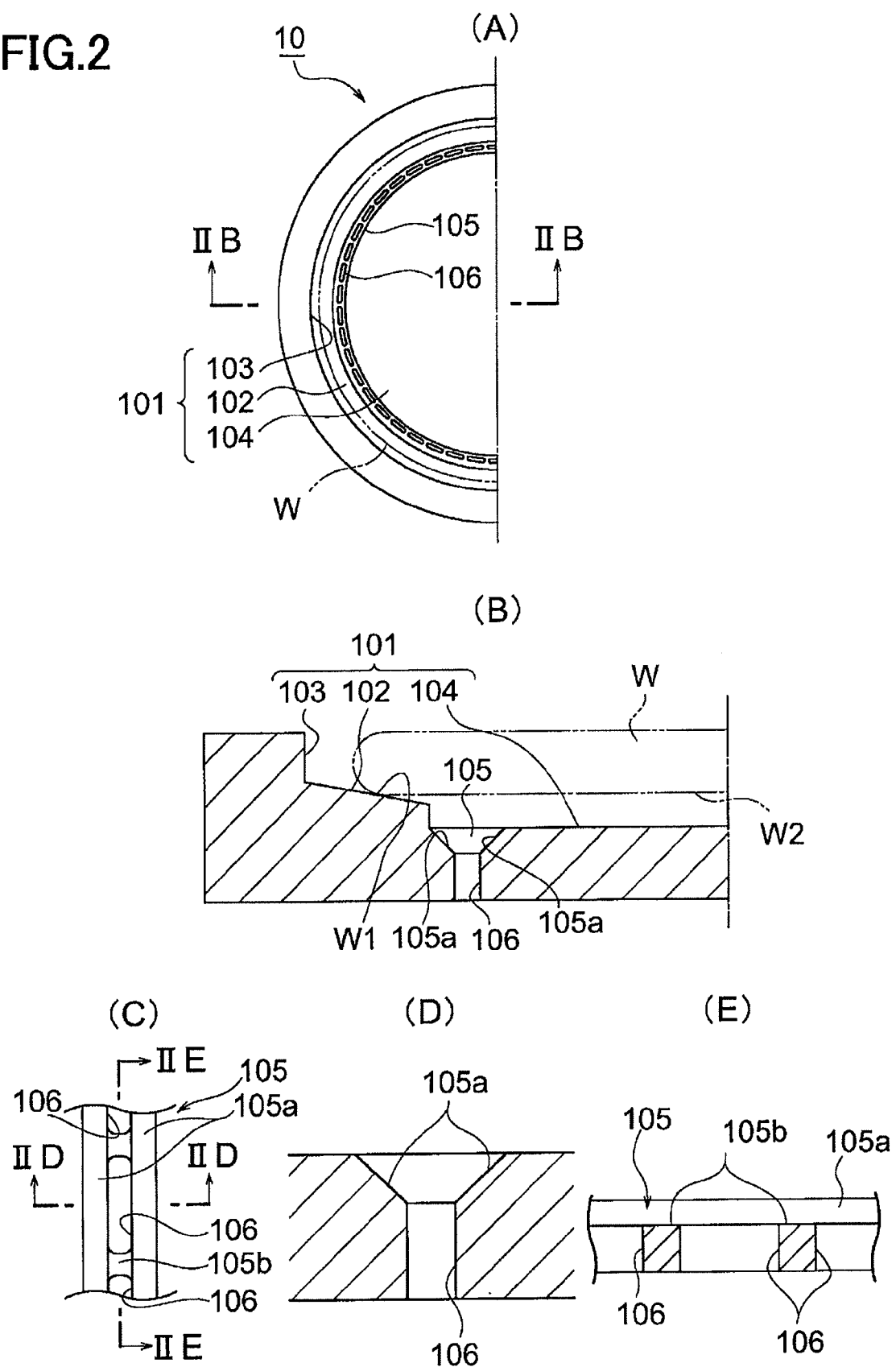
FIG. 2A is a half plan view of the susceptor according to the embodiment of the present invention.
FIG. 2B is a half sectional view along the line IIB-IIB.
FIG. 2C is an enlarged plan view of a ring-shaped groove.
FIG. 2D is a sectional view along the line IID-IID.
FIG. 2E is a sectional view along the line IIE-IIE.

In a susceptor having the configuration as shown in FIG. 2, a diameter of the bottom surface was changed to 297 mm, a size of each gas release opening to 2.5 mm lengthwise×0.8 mm crosswise (opening area of 2.0 mm$^2$), and the opening area ratio of the gas release openings to 0.25%, so that a silicon wafer having a diameter of 300 mm can be loaded.

The ring-shaped groove 105 was formed to be one row on the outermost circumference of the bottom surface 104, wherein the bottom portion 105b has two sloping planes 105a formed on both sides thereof and the gas release openings 106 were formed on the bottom surface of the ring-shaped groove 105 by the number of 130.

A hundred of silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was observed by using a CCD camera from over the susceptor and measured. It was determined "O" when 95 or more wafers had a deviation amount within ±0.3 mm, while "x" when 75 or less to evaluate the loading stability. Note that, at the same time, arising of slip defects, a film thickness distribution of the epitaxial film, a resistivity distribution, and lifetime were also measured; and even if the loading stability was determined as "O", when any one of those wafer qualities was not good, they were evaluated as "Δ".

Example 2

Other than changing the opening area ratio of the gas release openings to 0.5%, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Example 3

Other than changing the opening area of each of the gas release openings to 3.0 mm$^2$, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Example 4

Other than changing the opening area of each of the gas release openings to 3.0 mm$^2$ and the opening area ratio of the gas release openings to 0.5%, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Comparative Example 1

Other than not forming any gas release openings on the bottom surface o the susceptor, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Comparative Example 2

Other than changing the opening area ratio of the gas release openings to the bottom surface area to 0.1%, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Comparative Example 3

Other than changing the opening area ratio of the gas release openings to the bottom surface area to 0.8%, a susceptor was manufactured under the same condition as that in the example 1. Silicon wafers having a diameter of 300 mm were loaded on the susceptor by supporting the lower surface of each wafer by pins and lowering the pins to place on the wafer pocket 101 from above the susceptor 10. An amount of deviation of the center of the wafer from the center of the wafer pocket was measured.

Comparative Example 4

Other than changing the opening area of each of the gas release openings to 1.0 mm$^2$, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Comparative Example 5

Other than changing the opening area of each of the gas release openings to 4.0 mm$^2$ and the opening area ratio of the gas release openings to the bottom surface area to 0.8%, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Comparative Example 6

Other than changing the opening area of each of the gas release openings to 217 mm$^2$ and the opening area ratio of the gas release openings to the bottom surface area to 5%, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Comparative Example 7

Other than changing the opening area of each of the gas release openings to 433 mm$^2$ and the opening area ratio of the gas release openings to the bottom surface area to 10%, a susceptor was manufactured under the same condition as that in the example 1. Silicon wafers having a diameter of 300 mm were loaded on the susceptor by supporting the lower surface of each wafer by pins and lowering the pins to place the wafer in the wafer pocket 101 from above the susceptor 10. An amount of deviation of the center of the wafer from the center of the wafer pocket was measured.

Figure 7:
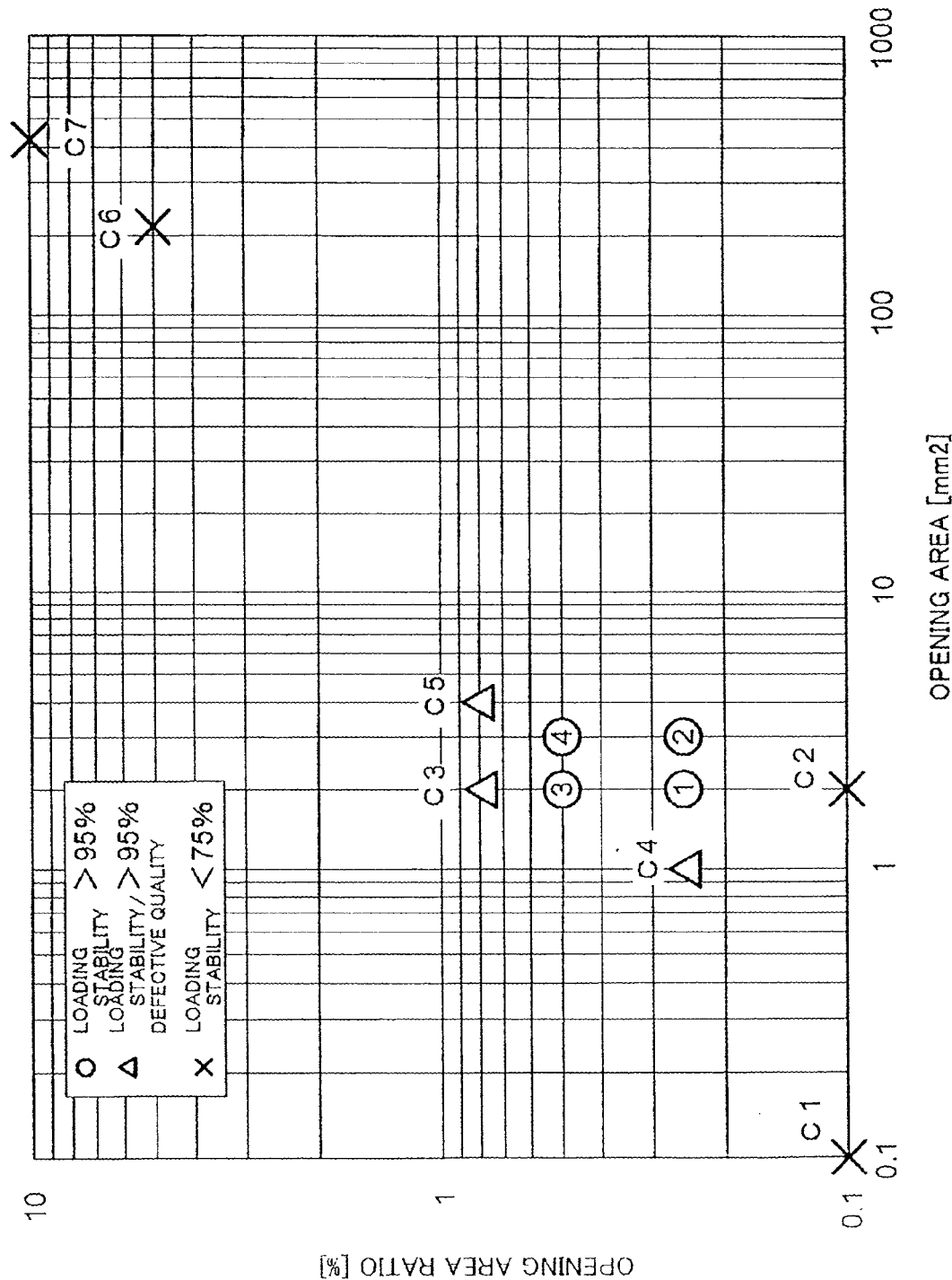
FIG. 7 is a graph showing results of examples and comparative examples of the present invention.

Results of the examples 1 to 4 and comparative examples 1 to 7 as above are shown in Table 1 and FIG. 7.

TABLE 1

|  | Example | | | | Comparative Example | | | | | | |
| --- | --- | --- | --- | --- | --- | --- | --- | --- | --- | --- | --- |
|  | 1 | 2 | 3 | 4 | 1 | 2 | 3 | 4 | 5 | 6 | 7 |
| Opening Area [mm$^2$] | 2 | 2 | 3 | 3 | 0 | 2 | 2 | 1 | 4 | 216.5 | 433 |
| Opening Area Ratio [%] | 0.25 | 0.5 | 0.25 | 0.5 | 0 | 0.1 | 0.8 | 0.25 | 0.8 | 5 | 10 |
| Loading Stability | ○ | ○ | ○ | ○ | X | X | Δ | Δ | Δ | X | X |
| Slip | — | — | — | — | — | — | X | — | X | X | X |
| Epitaxial Thin Film Distribution | — | — | — | — | — | — | — | — | — | X | X |
| Epitaxial Resistivity Distribution | — | — | — | — | — | — | — | — | — | X | X |
| Lifetime | — | — | — | — | — | — | — | X | — | — | — |

[Consideration]

From the results of the examples 1 to 4, it was confirmed that, when the opening area of each of the gas release openings 106 is set to be 2.0 to 3.0 mm$^2$ and a ratio of a total of the opening areas of the gas release openings 106 to the area of the bottom surface 104 to 0.25 to 0.5%, an amount of deviation of the center of the wafer from the center of the wafer pocket becomes illimitably close to zero at the time of loading a silicon wafer having a diameter of 300 mm by supporting the lower surface of the wafer by pins and lowering the pins to place the wafer in the wafer pocket 101 from above the susceptor 10.

On the other hand, the comparative examples 1, 2, 6 and 7 exhibited "×" in the loading stability (the comparative examples 6 and 7 also exhibited unsatisfactory results in all of the slip defects, film thickness distribution of the epitaxial film and resistivity distribution of the epitaxial film). It was confirmed that, in the case of largely different gas release openings from those in the above ranges, the amount of deviation of the center of the wafer from the center of the wafer pocket became large. The comparative examples 3 to 5 exhibited preferable loading stability, however, the slip defects arose in the comparative examples 3 and 5 and the lifetime was unsatisfactory in the comparative example 4.

What is claimed is:

1. A susceptor for a vapor phase epitaxial growth device, comprising a wafer pocket being recessed from the surface toward the inside for a silicon wafer to be loaded formed therein, wherein
the wafer pocket comprises:
a bottom surface;
a sloping support plane which is formed on an outer circumference of the bottom surface and supports a wafer;
a side surface formed at an outer circumference of the sloping support plane and extending to the susceptor surface;
a ring-shaped groove formed in one row on the outermost circumference of the bottom surface, having a bottom portion forming a groove configuration and two sloping planes formed on both sides of the bottom portion and widening toward the bottom surface; and
a plurality of gas release openings extending from the ring-shaped groove to penetrate to the back surface of the susceptor so as to release a gas in the wafer pocket to below the susceptor, each having an opening area of 2.0 to 3.0 mm$^2$ and having a ratio of opening areas to the bottom surface of 0.25 to 0.5%.

2. The susceptor for a vapor phase epitaxial growth device as set forth in claim 1, wherein the sloping surface is formed on both of the outer circumferential side and inner circumferential side of the gas release openings formed on the groove.

3. The susceptor for a vapor phase epitaxial growth device as set forth in claim 1, wherein the sloping plane is formed only on the inner circumferential side of the gas release openings formed on the groove, and the gas release openings are formed on the outermost circumference of the bottom surface.

4. The susceptor for a vapor phase epitaxial growth device as set forth in claim 3, wherein the ring-shaped groove has a vertical wall at the upper end of the sloping plane.

5. The susceptor for a vapor phase epitaxial growth device as set forth in claim 1, wherein each of the gas release openings is formed to be sloping, so that an opening thereof on the surface side of the susceptor body is positioned front with respect to the opening on the back surface in the rotation direction of the susceptor body.

6. The susceptor for a vapor phase epitaxial growth device as set forth in claim 1, wherein a diameter of the silicon wafer is 300 mm or larger.

7. The susceptor for a vapor phase epitaxial growth device as set forth in claim 1, wherein the support plane is formed by a step portion connecting between the outermost circumference of the bottom surface and the lower end of the side surface.

8. The susceptor for a vapor phase epitaxial growth device as set forth in claim 1, wherein the two sloping planes are formed to be sloping by 5 to 30 degrees from the level plane.

* * * * *